(12) United States Patent
O'Carroll

(10) Patent No.: US 10,693,098 B2
(45) Date of Patent: Jun. 23, 2020

(54) PHOSPHORESCENT EMITTERS AND EXTRINSIC METHOD FOR INCREASING STABILITY THEREOF

(71) Applicant: Rutgers, The State University of New Jersey, New Brunswick, NJ (US)

(72) Inventor: Deirdre O'Carroll, Metuchen, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 0 days.

(21) Appl. No.: 16/053,116

(22) Filed: Aug. 2, 2018

(65) Prior Publication Data

US 2019/0044084 A1 Feb. 7, 2019

Related U.S. Application Data

(60) Provisional application No. 62/540,378, filed on Aug. 2, 2017.

(51) Int. Cl.
*H01L 51/50* (2006.01)
*H01L 51/00* (2006.01)
*H01L 51/52* (2006.01)

(52) U.S. Cl.
CPC ...... *H01L 51/5028* (2013.01); *H01L 51/0035* (2013.01); *H01L 51/0072* (2013.01);
(Continued)

(58) Field of Classification Search
CPC ............. H01L 51/0032; H01L 51/5024; H01L 51/502
(Continued)

(56) References Cited

U.S. PATENT DOCUMENTS

2005/0035346 A1* 2/2005 Bazan ................ B82Y 20/00
257/40
2010/0123389 A1 5/2010 Takasu et al.
(Continued)

OTHER PUBLICATIONS

H. Cang, Y Liu, Y. Wang, X. Yin, X. Zhang, "Giant Suppression of Photobleaching for Single Molecule Detection via the Purcell Effect." Nano Lett. 13, 5949-5953 (2013).
(Continued)

*Primary Examiner* — David Vu
*Assistant Examiner* — Brandon C Fox
(74) *Attorney, Agent, or Firm* — Meagher Emanuel Laks Goldberg & Liao, LLP

(57) ABSTRACT

Light-emitting devices having an emitting layer containing a light-emitting organic or organometallic material and a nanostructure, the nanostructure having strong local electric fields at visible electromagnetic wavelengths that spectrally and spatially overlap with the light-emitting material. The spectral and spatial overlap of the electric fields of the nanostructure with the light emitting material uses high LDOS provided by the nanostructures to enable excited triplet electronic states in the material to emit light faster than without the nanostructure. This faster light emission from triplet-excited states leads to more stable emission from the light emitting material because it prevents buildup of triplet-excited states, which ordinarily can lead to quenching of light emission from the light emitting material. Among the many different possibilities contemplated, the nanostructure may advantageously be made of a dielectric material or a plasmonic metal material, such as $SiO_2$, $TiO_2$, ZnO, Al or Ag. It is further contemplated that the light-emitting material be capable of exhibiting at least one of phosphorescence or thermally-assisted delayed fluorescence. Many light-emitting materials, including blue light emitters, may be utilized, and may also be doped into a host
(Continued)

material. It is still further contemplated that the nanostructure may be a nanoantenna, a nanoparticle, such as a sphere or rod, a nanoporous film, or an imprinted grating, and the nanostructure may be on either side of the light-emitting material, or may be surrounded by or embedded in the host material. The light-emitting device may also advantageously include other layers, including but not limited a hole transport layer, a hole blocking layer, an electron transport layer, a hole injection layer, or an electron injection layer. Further, the device may also be configured for use in various applications, including but not limited to bioimaging, photochemistry, and single molecule spectroscopy.

21 Claims, 10 Drawing Sheets

(52) U.S. Cl.
CPC ........ *H01L 51/0085* (2013.01); *H01L 51/502* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01); *H01L 2251/301* (2013.01); *H01L 2251/303* (2013.01)

(58) Field of Classification Search
USPC .................................................... 257/13, 40
See application file for complete search history.

(56) References Cited

U.S. PATENT DOCUMENTS

2016/0133424 A1    5/2016    Chou et al.
2017/0346012 A1*  11/2017    Koo .................... H01L 51/0061

OTHER PUBLICATIONS

G. D. Hale, J. B. Jackson, O. E. Shmakova, T. R. Lee, N. J. Halas, "Enhancing the active lifetime of luminescent semiconducting polymers via doping with metal nanoshells." Appl. Phys. Lett. 78, 1502-1504 (2001).

F. D. Stefani, K. Vasilev, N. Bocchio, F. Gaul, A. Pomozzi, M. Kreiter, "Photonic mode density effects on single-molecule fluorescence blinking." New J. Phys. 9, 21 (2007).

W. Ji, L. Zhang, W. Xie, "Improving efficiency roll-off in phosphorescent OLEDs by modifying the exciton lifetime." Opt. Lett. 37, 2019-2021 (2012).

International Search Report for PCT/US18/44988, dated Oct. 11, 2018.

* cited by examiner

PHOSPHORESCENT EMITTERS AND EXTRINSIC METHOD FOR INCREASING STABILITY THEREOF

STATEMENT REGARDING FEDERALLY SPONSORED RESEARCH OR DEVELOPMENT

This invention was made with government support under Grant No. DMR-1551954 awarded by the National Science Foundation (NSF). The United States government has certain rights in the invention.

BACKGROUND

State-of-the-art, high-efficiency blue phosphorescent and thermally-activated delayed fluorescence (TADF) organic light-emitting devices (OLEDs) exhibit operational lifetimes that are at least 20 and 45 times shorter than state-of-the-art, high-efficiency green and red OLEDs, respectively (the latter having $L_{50}$ lifetimes of up to 900,000 h at 1000 cd/m$^2$; device lifetime, $L_{50}$, defined as the time to reach 50% of initial luminance). Thus, while organic electroluminescent devices employing green and red triplet-exciton-harvesting and triplet-exciton-emitting (i.e., phosphorescent) materials have met the requirements for various applications, including but not limited to modern-day lighting and display technologies, the development of stable, high-efficiency blue organic light-emitting devices is an ongoing challenge.

As a result, to-date, there are no commercial OLED lighting or display products that incorporate high-efficiency, blue phosphorescent or TADF emitters. (Y. Zhang, J. Lee, S. R. Forrest, Tenfold increase in the lifetime of blue phosphorescent organic light-emitting diodes. *Nat. Commun.* 5, 5008 (2014); S. Reineke Complementary LED technologies, *Nat. Mater.* 14, 459-462 (2015); J.-H. Jou, S. Kumar, A. Agrawal, T.-H. Li, S. Sahoo, Approaches for fabricating high efficiency organic light emitting diodes. *J. Mater. Chem. C,* 3, 2974-3002 (2015)). Existing commercial OLED devices predominantly employ blue fluorescent materials with low internal quantum efficiencies (~25% due to the lack of triplet exciton harvesting), but reasonably long device lifetime ($L_{50}$ up to 50,000 h at 1000 cd/m$^2$ reported for blue fluorescent OLEDs in commercial displays). (R. Mertens, The OLED Handbook (2015), publisher: Ron Mertens; J.-H. Jou, S. Kumar, A. Agrawal, T.-H. Li, S. Sahoo, Approaches for fabricating high efficiency organic light emitting diodes. *J. Mater. Chem. C,* 3, 2974-3002 (2015); H. Kuma, C. Hosokawa, Blue fluorescent OLED materials and their application for high performance devices. *Sci. Technol. Adv. Mater.* 15, 034201-1-7 (2014)). It has been predicted that should stable, high-efficiency blue phosphorescent OLEDs be added to OLED display technologies, a 30% savings in power consumption could be realized. This represents a significant energy savings to the consumer and could substantially improve the energy efficiency of lighting and display technologies, in addition to improving their operational lifespan. (OLED-info, http://www.oled-info.com/blue-pholed-breakthrough-researchers-manageextend-lifetime-tenfold, accessed July 2017).

Maintaining both long-term stability and high efficiency has been problematic due to the long electronic excited-state lifetimes of phosphorescent materials and particularly so for blue emitters due to their high energy (i.e., large bandgap) electronic excited states which facilitate multiple undesirable non-radiative decay pathways. Furthermore, achieving deep-blue or true blue emission (430-465 nm wavelength range) with Commission Internationale de L'Eclairage coordinates, CIE (x,y), of (0.14, 0.08) has proven to be a significant challenge. (Y. Zhang, J. Lee, S. R. Forrest, Tenfold increase in the lifetime of blue phosphorescent organic light-emitting diodes. *Nat. Commun.* 5, 5008 (2014); H. Kuma, C. Hosokawa, Blue fluorescent OLED materials and their application for highperformance devices. *Sci. Technol. Adv. Mater.* 15, 034201-1-7 (2014); T. Sajoto, P. I. Djurovich, A. B. Tamayo, J. Oxgaard, Temperature Dependence of Blue Phosphorescent Cyclometalated Ir(III) Complexes, *J. Am. Chem. Soc.* 131, 9813-9822 (2009); Y. J. Cho, K. S. Yook, J. Y. Lee, Cool and warm hybrid white organic light-emitting diode with blue delayed fluorescent emitter both as blue emitter and triplet host. *Sci. Rep.* 5, 7859-1-7 (2015); H. Fu, Y.-M. Cheng, P.-T. Chou, Y. Chi, Feeling blue? Blue phosphors for OLEDs. *Mater. Today,* 14, 472-479 (2011)). Due to the low stability of blue phosphors, lighting applications have been particularly impeded due to the high power efficiencies required for lighting applications compared to display applications.

In organic light-emitting materials, the yield of singlet excitons to triplet excitons under optical excitation is usually different to that under electrical excitation. Under optical excitation of singlets there is little or no conversion to the triplet state due to strong spatial localization and the large exciton binging energy of the Frenkel-type singlet excitons and, hence, their large exchange energy. (A. P. Monkman, Singlet Generation from Triplet Excitons in Fluorescent Organic Light-Emitting Diodes. *ISRN Mater. Sci.* 670130 (2013)). Under electrical excitation, electron and hole polarons are formed that are initially uncorrelated—i.e., their spin states are randomly oriented with respect to one another. Only at the point of recombination do they become correlated and both singlet and triplet excitons form. If it is assumed that recombination is spin independent, 75% or excitons that are formed are triplets and 25% are singlets. This has been demonstrated to be the case particularly for small organic conjugated molecular systems. (J. Wang, A. Chepelianskii, F. Gao, N. C. Greenham, Control of exciton spin statistics through spin polarization in organic optoelectronic devices. *Nature Commun.* 3, 1191 (2012); I. Bergenti, V. Dediu, E. Arisi, T. Mertelj, M. Murgia, A. Riminucci, G. Ruani, M. Solzi, C. Taliani, Spin polarised electrodes for organic light emitting diodes. *Org. Electron.* 5, 309-314 (2004); J. S. Wilson, A. S. Dhoot, A. J. A. B. Seeley, M. S. Khan, A. Kohler, R. H. Friend, Spindependent exciton formation in pi-conjugated compounds. *Nature* 413, 828-831 (2001); A. Köhler, H. Bässler, Triplet states in organic semiconductors. *Mater. Sci. Eng. R* 66, 71-109 (2009); Y. Zhang, M. Whited, M. E. Thompson, S. R. Forrest, Singlet-triplet quenching in high intensity fluorescent organic light emitting diodes. Chem. Phys. Lett. 495, 161-165 (2010)). Since triplet exciton radiative decay is a forbidden transition, for triplets to emit light, organometallic molecules (i.e., "triplet-harvesting emitter materials"; typically iridium-based organometallic complexes) that facilitate triplet radiative decay either by spin-orbit coupling due to the "heavy" atom of the transition metal or by TADF are incorporated into the emissive layer. (S. Kappaun, C. Slugovc, E. J. W. List, Phosphorescent Organic Light-Emitting Devices: Working Principle and Iridium Based Emitter Materials. *Int. J. Mol. Sci.* 9, 1527-1547 (2008); H. Uoyama, K. Goushi, K. Shizu, H. Nomura, C. Adachi, Highly efficient organic light emitting diodes from delayed fluorescence. *Nature* 492, 234-238 (2012)). These dopants accelerate intersystem crossing from excited singlet to light-emitting triplet states (and vice versa in the case of TADF) and thus significantly improve the internal quantum efficiency. As a result, close to 100% of excitons electrically excited can decay radiatively and emit light, thereby yielding high-efficiency OLED devices.

For high-efficiency, phosphorescent emitters at low luminances, the radiative lifetime ($\sigma^T_r$) is faster than the non-radiative lifetimes ($\sigma^T_{nr}$). However, for blue organic phosphorescent materials, in particular, it has been shown that an additional fast non-radiative decay component (triplet quenching) is introduced due to defect formation when triplet-polaron annihilation (TPA) and triplet-triplet annihilation (TTA) occur ($\pi_{nr}{}^Q$). (N. C. Giebink, B. W. D'Andrade, M. S. Weaver, P. B. Mackenzie, J. J. Brown, M. E., Thompson, S. R. Forrest, Intrinsic luminance loss in phosphorescent small-molecule organic light emitting devices due to bimolecular annihilation reactions. *J. Appl. Phys.* 103, 044509 (2008); Y. Zhang, J. Lee, S. R. Forrest, Tenfold increase in the lifetime of blue phosphorescent organic light-emitting diodes. *Nat. Commun.* 5, 5008 (2014); N. C. Giebink, B. W. D'Andrade, M. S. Weaver, J. J. Brown, S. R. Forrest, Direct evidence for degradation of polaron excited states in organic light emitting diodes. *J. Appl. Phys.* 105, 124514 (2009); R. Coehoorn, H. van Eersel, P. A. Bobbert, R. A. J. Janssen, Kinetic Monte Carlo Study of the Sensitivity of OLED Efficiency and Lifetime to Materials Parameters. *Adv. Funct. Mater.* 25, 2024-2037 (2015)). This is the main cause of the short blue operational lifetimes in high-efficiency blue phosphorescent OLEDs (note that operational lifetimes quantify the stability of the OLED devices; radiative and non-radiative lifetimes quantify how fast excited electrons recombine with holes in a ground electronic state). Further degradation of high-efficiency blue phosphorescent emitters (i.e., triplet exciton emitters) occurs at high luminance due to accumulations of non-radiative recombination centers and quenchers in the light emitting zone. (R. Coehoorn, H. van Eersel, P. A. Bobbert, R. A. J. Janssen, Kinetic Monte Carlo Study of the Sensitivity of OLED Efficiency and Lifetime to Materials Parameters. *Adv. Funct. Mater.* 25, 2024-2037 (2015); D. Y. Kondakov, W. C. Lenhart, W. F. Nichols, Operational degradation of organic light emitting diodes: Mechanism and identification of chemical products, *J. Appl. Phys.* 101, 024512 (2007); R. Seifert, I. R. de Moraes, S. Scholz, M. C. Gather, B. Lüssem, K. Leo, Chemical degradation mechanisms of highly efficient blue phosphorescent emitters used for organic light emitting diodes. *Org. Electron.* 14, 115-123 (2013)). Besides TPA and TTA, other factors that contribute to triplet quenching are: (1) field-induced exciton dissociation; (2) loss of charge balance; and (3) triplet oxygen quenching. (N. C. Giebink, B. W. D'Andrade, M. S. Weaver, P. B. Mackenzie, J. J. Brown, M. E. Thompson, S. R. Forrest, Intrinsic luminance loss in phosphorescent small-molecule organic light emitting devices due to bimolecular annihilation reactions. *J. Appl. Phys.* 103, 044509 (2008)). Due to these stability issues associated with blue organic phosphorescent emitters, all commercial OLED displays currently use low-efficiency blue fluorescent emitters, which limits their energy conversion efficiencies (i.e., electrical-to-light conversion efficiencies). The more stable phosphorescent true-blue emitters exhibit device operational lifetimes of a few thousand hours at best, far short of the ~10,000 h required for commercial viability. (N. C. Giebink, B. W. D'Andrade, M. S. Weaver, P. B. Mackenzie, J. J. Brown, M. E. Thompson, S. R. Forrest, Intrinsic luminance loss in phosphorescent small-molecule organic light emitting devices due to bimolecular annihilation reactions. *J. Appl. Phys.* 103, 044509 (2008); Y. Zhang, J. Lee, S. R. Forrest, Tenfold increase in the lifetime of blue phosphorescent organic light-emitting diodes. *Nat. Commun.* 5, 5008 (2014); R. Mertens, The OLED Handbook (2015), publisher: Ron Mertens; M. Kim, S. K. Jeon, S.-H. Hwang, J. Yeob Lee, Stable Blue Thermally Activated Delayed Fluorescent Organic Light-Emitting Diodes with Three Times Longer Lifetime than Phosphorescent Organic Light-Emitting Diodes, *Adv. Mater.* 27, 2515-2520 (2015)). Recently, Forrest and co-workers extended the lifetime of blue phosphorescent OLEDs by a factor of 10 to ~3,500 h ($L_{50}$) at 1000 cd/m² by grading the emissive dopant concentration profile in the emissive layer which led to lower exciton densities and, hence, lower TPA compared to conventional devices. (Y. Zhang, J. Lee, S. R. Forrest, Tenfold increase in the lifetime of blue phosphorescent organic light-emitting diodes. *Nat. Commun.* 5, 5008 (2014)). Furthermore, it is notable that, while TTA degrades the performance of phosphorescence OLEDs, TTA can improve the performance of fluorescent OLED devices mainly because, of the ~75% of triplets that form upon electrical excitation of fluorescent materials, pairs of triplets can annihilate to form a higher energy singlet exciton. Thus, theoretically increasing the yield of singlet exciton emission to 62.5% [25%+(75%/2)]. (C. Ganzorig, M. Fujihira, A possible mechanism for enhanced electrofluorescence emission through triplet-triplet annihilation in organic electroluminescent devices. *Appl. Phys. Lett.* 81, 3137 (2002); D. Y. Kondakov, T. D. Pawlik, T. K. Hatwar, J. P. Spindler, Triplet annihilation exceeding spin statistical limit in highly efficient fluorescent organic light-emitting diodes. *J. Appl. Phys.* 106, 124510 (2009); C. Mayr, T. D. Schmidt, W. Brutting, High-efficiency fluorescent organic light-emitting diodes enabled by triplet-triplet annihilation and horizontal emitter orientation. *Appl. Phys. Lett.* 105, 183304 (2014); H. Fukagawa, T. Shimizu, N. Ohbe, S. Tokito, K. Tokumaru, H. Fujikake, Anthracene derivatives as efficient emitting hosts for blue organic light-emitting diodes utilizing triplet—triplet annihilation. *Org. Electron.* 13, 1197-1203 (2012)). However, the stability of such TTA processes have yet to be determined.

As an alternative to rare-earth or noble-metal-containing organometallic phosphors that harvest triplet emission by spin-orbit coupling, metal-free organic molecules that exhibit TADF have been developed as an approach to achieving high-efficiency emitters for OLED applications that harvest both singlet and triplet excitons. (H. Uoyama, K. Goushi, K. Shizu, H. Nomura, C. Adachi, Highly efficient organic lightemitting diodes from delayed fluorescence. *Nature* 492, 234-238 (2012); Q. Zhang, B. Li, S. Huang, H. Nomura, H. Tanaka, C. Adachi, Efficient blue organic light emitting diodes employing thermally activated delayed fluorescence. *Nat. Photon.* 8, 326-332 (2014); H. Nakanotani, T. Higuchi, T. Furukawa, K. Masui, K. Morimoto, M. Numata, H. Tanaka, Y. Sagara, T Yasuda, C. Adachi, High-efficiency organic light-emitting diodes with fluorescent emitters. *Nat. Commun.* 5, 4016-1-7 (2014); H. Nakanotani, K. Masui, J. Nishide, T. Shibata, C. Adachi, Promising operational stability of high-efficiency organic light-emitting diodes based on thermally activated delayed fluorescence. *Sci. Rep.* 3, 2127-1-5 (2013)). Molecules that emit by TADF have small energy differences between singlet and triplet excited electronic states, thereby allowing efficient spin conversion without needing heavy metal atoms. While high internal quantum efficiency is obtainable using TADF, radiative lifetimes of high-efficiency blue TADF molecules are similar to those of high-efficiency blue organometallic phosphors (1-3 μs) because short triplet lifetimes compete with reverse inter-system crossing which is necessary for efficient TADF. (H. Uoyama, K. Goushi, K. Shizu, H. Nomura, C. Adachi, Highly efficient organic lightemitting diodes from delayed fluorescence. *Nature* 492, 234-238 (2012); Q. Zhang, B. Li, S. Huang, H. Nomura, H. Tanaka, C. Adachi, Efficient blue organic light emitting diodes employing thermally activated delayed fluorescence. *Nat. Photon.* 8, 326-332 (2014)). Promising operational lifetimes of up to 2,800 h (at 1000 cd/m$^2$) and 52 h (at 500 cd/m$^2$) have been reported at yellow and blue wavelengths, respectively, for TADF OLEDs. (H. Nakanotani, T. Higuchi, T. Furukawa, K. Masui, K. Morimoto, M. Numata, H. Tanaka, Y. Sagara, T Yasuda, C. Adachi, High-efficiency organic light-emitting diodes with fluorescent emitters. *Nat. Commun.* 5, 4016-1-7 (2014); H. Nakanotani, K. Masui, J. Nishide, T. Shibata, C. Adachi, Promising operational stability of high-efficiency organic light-emitting diodes based on thermally activated delayed fluorescence. *Sci. Rep.* 3, 2127-1-5 (2013); M. Kim, S. K. Jeon, S.-H. Hwang, J. Y. Lee, Stable Blue Thermally Activated Delayed Fluorescent Organic Light-Emitting Diodes with Three Times Longer Lifetime than Phosphorescent Organic Light-Emitting Diodes. *Adv. Mater.* 27, 2515-2520 (2015)). However, it is yet to be determined if the stabilities of TADF OLEDs can improve upon those of state-of-the-art phosphorescent OLEDs.

Fermi's Golden Rule states that the spontaneous emission rate (i.e., the radiative decay rate, $\Gamma_r$, ($=\sigma_r^{-1}$)) is proportional to two factors: (1) the transition dipole moment of an emitting dipole; and (2) the surrounding local density of optical states (LDOS). The former is an intrinsic property of the molecule, while the latter is an extrinsic property of the optical environment in which the molecules is situated.

Current technologies are focused solely on intrinsic methods for increasing stability. Various approaches have been investigated, yet high-efficiency blue OLED operational lifetimes are still too short for commercial viability. Thus, an extrinsic method for improving stability is beneficial and needed.

SUMMARY OF THE INVENTION

The present invention is directed to stabilizing the triplet state of a molecule. In the present invention, apparatus and methods are provided to take advantage of that stabilization, such as light emitting devices having an emitting layer that includes a light emitting organic or organometallic material and a nanostructure, the nanostructure having local electric fields at visible electromagnetic wavelengths that both spectrally and spatially overlap with the light emitting organic or organometallic material. The spectral and spatial overlap of the electric fields of the nanostructure with the light emitting material enables excited triplet electronic states in the material to emit light faster than without the nanostructure. This faster light emission from triplet excited states leads to more stable emission from the light emitting material because it prevents buildup of triplet excited states, which ordinarily can lead to quenching of light emission from the light emitting material. Among the many different possibilities contemplated, the nanostructure may advantageously be made of a dielectric material or a plasmonic material, including transition metals, post-transition metals, metalloids, or oxides thereof, and specifically may be made of Al, Ag, SiO$_2$, TiO$_2$, or ZnO. It is further contemplated that the light emitting material be capable of exhibiting at least one of phosphorescence or thermally-assisted delayed fluorescence. It is further contemplated that it may be advantageous to utilize blue phosphorescent light emitting materials, such as bis[2-(4,6-difluorophenyl)pyridinato-C2,N](picolinato) iridium(III), bis(2,4-difluorophenyl pyridinato)tetrakis(1-yrazolyl)borate iridium(III), 4,5-di(9H-carbazol-9-yl)phthalonitrile, or the (PCP)Ir(ppy)Cl complex. Other materials, including those that emit green or red light, may also be utilized. The light emitting material may also be doped into a host material such as a polyvinylcarabzole (PVK) conjugated polymer or any other conjugated polymer that has a triplet energy level higher than the triplet state of the organic or organometallic emitting material/dopant, and the light emitting material, or the doped host material, may have a thickness of between about 20 and about 200 nm. It is still further contemplated that the nanostructure may be a nanoparticle, such as a sphere or rod, or a metasurface composed of a 2D periodic or aperiodic array of nanostructures, and the nanostructure may be on either side of the light emitting material, or may be surrounded by or embedded in the host material. The light emitting device may also advantageously include other layers, including but not limited a hole transport layer, a hole blocking layer, an electron transport layer, a hole injection layer, or an electron injection layer.

DETAILED DESCRIPTION OF THE INVENTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a", "an", and "the" include plural referents unless the context clearly dictates otherwise.

"Emitter" as used herein may refer to either a light emitting material, a light emitting material doped into a host material, or any other similar configuration comprising a light emitting material.

The present invention is drawn to changing the local external environment of the molecules to increase its stability for light emission, rather than identifying new molecules with increased intrinsic stability. Embodiments of the present invention shorten the radiative lifetimes of, for example, blue, green, or red phosphorescent organic materials using the high LDOS provided by nanophotonic structures (i.e., Purcell Effect). Shortening, e.g., blue phosphorescence radiative lifetimes to the sub-microsecond regime in that way can allow radiative emission to compete with triplet-triplet annihilation and triplet-polaron annihilation degradation pathways, which are known contributors to the low stability of high-efficiency blue phosphorescent organic light-emitting diodes (OLEDs).

Figure 1:
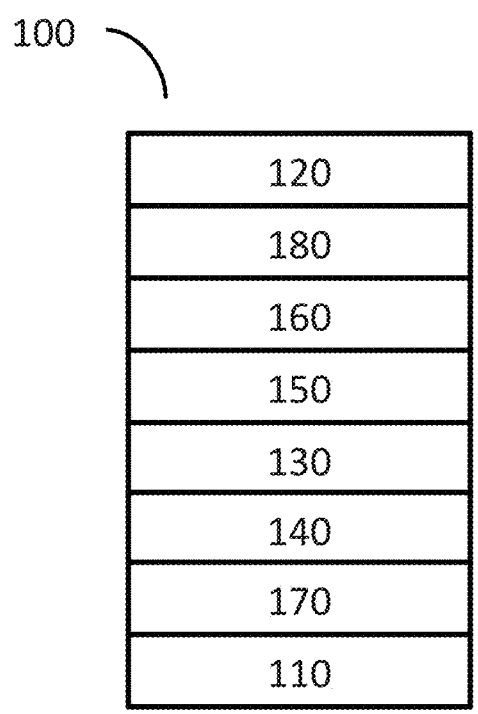
FIG. 1 illustrates one embodiment of the present invention.

FIG. 1 depicts one embodiment of the present invention. The light emitting device (100) comprises an anode (110), a cathode (120) and an emitting layer (130) between the anode and cathode. Optionally, the light emitting device may comprise one or more additional layers, including but not limited to a hole transport layer (140), a hole blocking layer (150), an electron transport layer (160), a hole injection layer (170), which may be a p-doped hole injection layer, or an electron injection layer (180), which may be an n-doped electron injection layer.

Figure 2A:
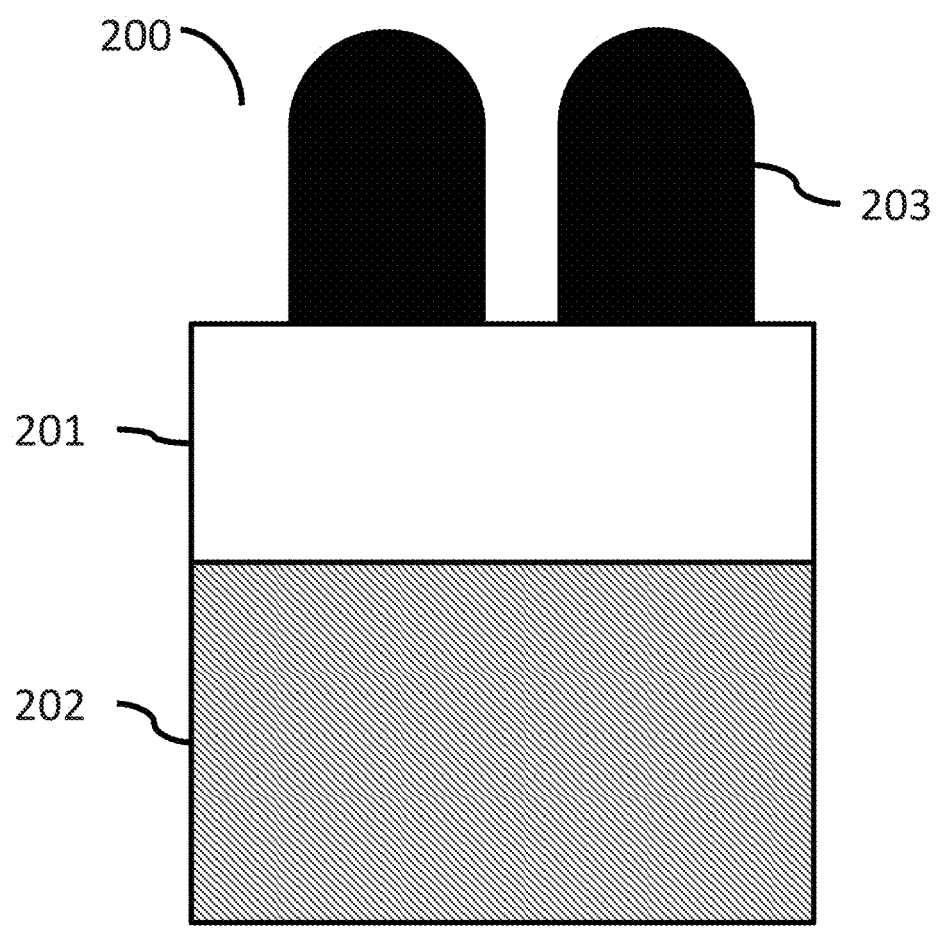
FIGS. 2A-2E illustrate embodiments of the emitting layer.
Figure 2B:
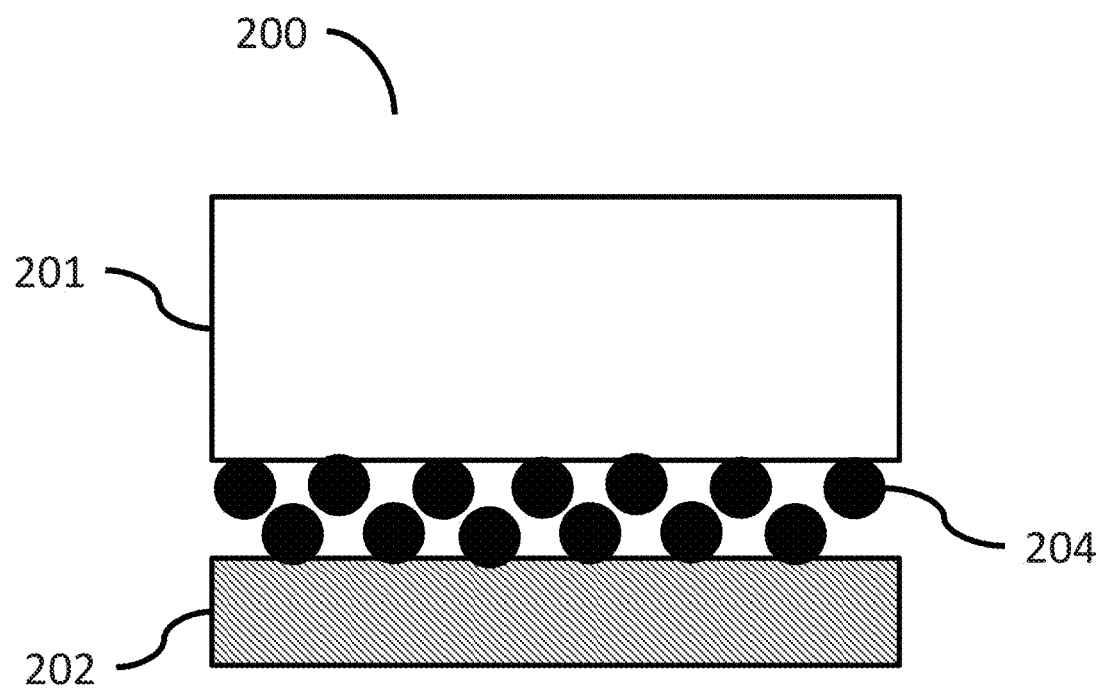
Figure 2C:
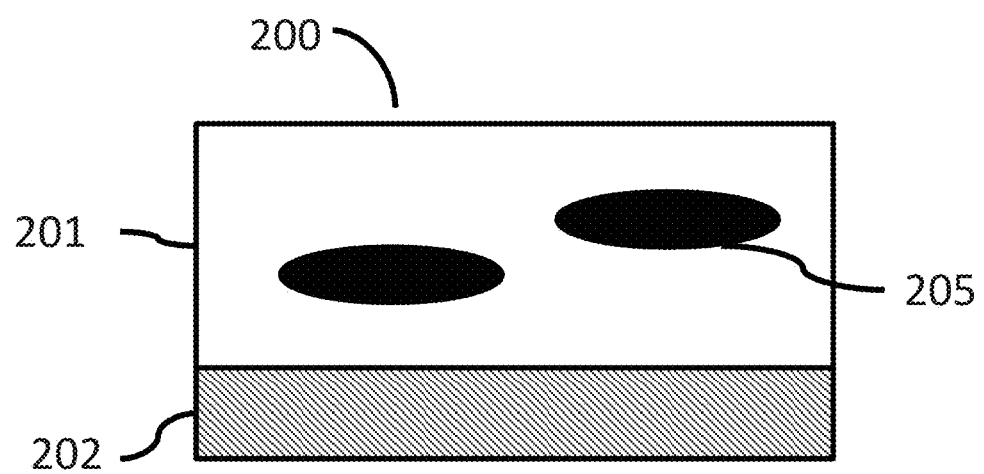

The emitting layer (130) generally requires at least one nanostructured material, and at least one light emitting organic or organometallic material. The nanostructured material can take a variety of forms, which may be arranged periodically or aperiodically. Several of forms are depicted in FIGS. 2A-2E. FIG. 2A is a simplified portion of a monopole antenna array. FIG. 2A shows a monopole nanoantenna having a height h and a diameter d, placed on top of a thin film of the light emitting material. Although the thickness of the light emitting material is not restricted, it is preferably less than 200 nm thick, and more preferably between 20 and 100 nm thick, and still more preferably between 20 and 50 nm thick. In FIG. 2A, the layer is 20 nm thick. The light emitting material layer in this figure is depicted as being located on a metallic (here, Aluminum) thin film ground plane (here, about 80 nm thick). FIGS. 2B and 2C show two different variations using nanoparticles. In FIG. 2B, a layer of nanoparticles, shown here as an array of substantially spherical nanoparticles is shown as being placed on a layer of PMMA deposited on glass. The light emitting material is doped into a host material, shown here as PVK:FIrpic, and layered over the nanoparticles. Other host materials may be utilized, which can include other conjugated polymers having a triplet energy level higher than the triplet state of the organic or organometallic emitting material/dopant.

Figure 2D:
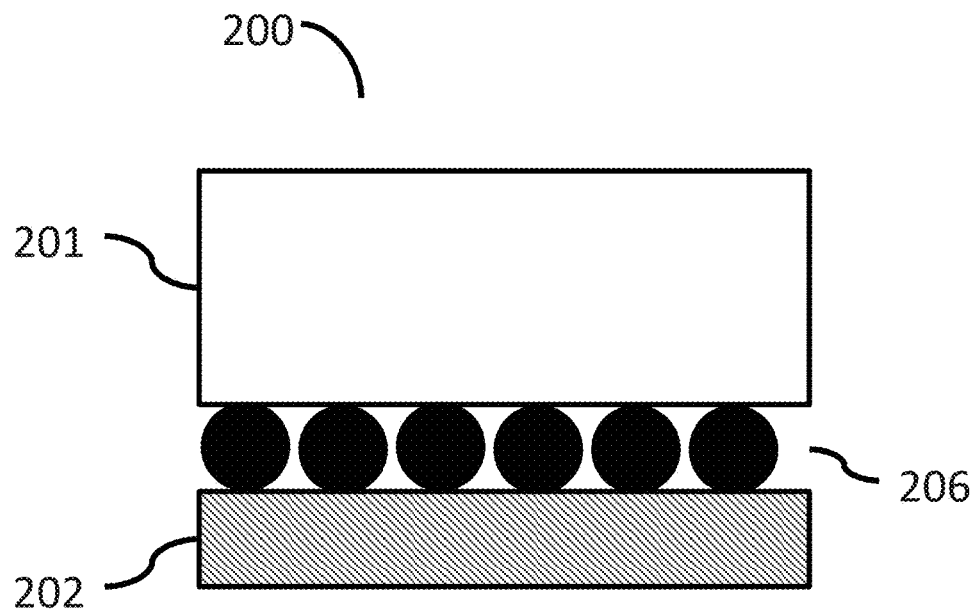
Figure 2E:
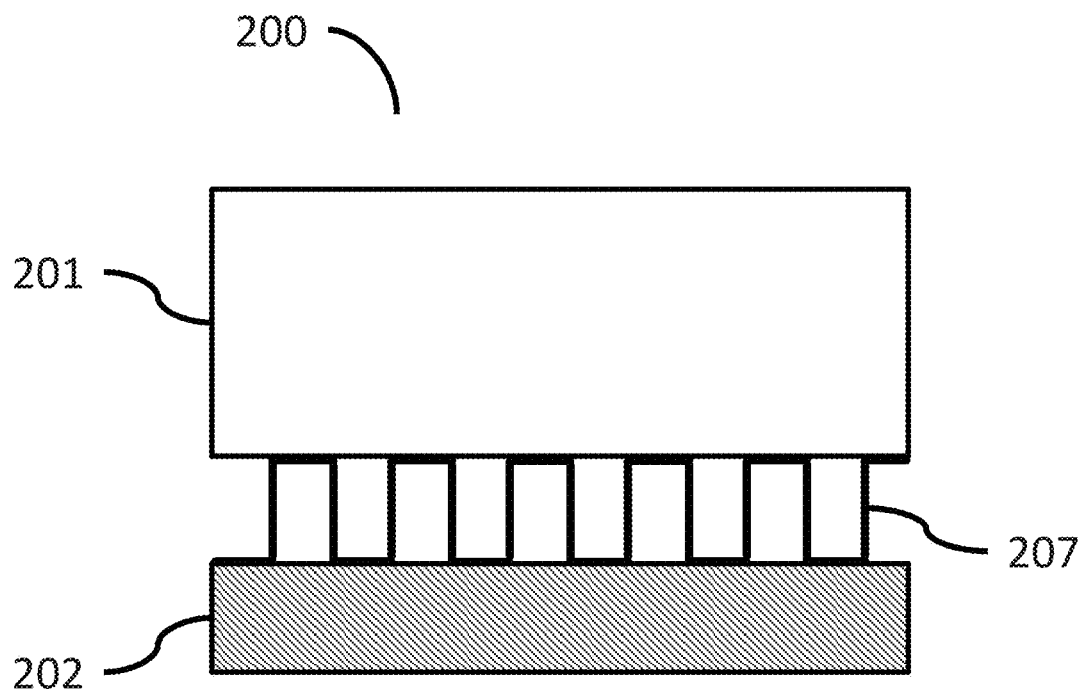

However, the location and geometries of the nanoparticles are not restricted to spheres outside of a doped host material. As shown in FIG. 2C, the nanoparticles may also be nanorods, which may be embedded in the emitter. Other nanoparticle shapes—regular or irregular—and other arrangements of nanoparticles—periodic or aperiodic—are also envisioned. For example, nanoparticles may include, but are not limited to nanorods, nanospheres, nanotriangles, nanostars, or nanocubes with dimensions less than the wavelength of the emission of the organic or organometallic material. FIGS. 2D and 2E are comparable to FIG. 2B, where FIG. 2D illustrates that a nanoporous metal film may also be utilized, and FIG. 2E indicates that an imprinted metal grating such as, but not limited to, a CD grating pattern (grating pitch of 1.6 µm) or DVD grating pattern (grating pitch of 0.7 µm) type imprint may be utilized.

When selecting a light emitting material, many light emitting materials are envisioned. Preferably, the light emitting material is an organic material that exhibits either phosphorescence or thermally-assisted delayed fluorescence. Preferably, the material is one that emits blue, green, or red light, having a peak wavelength between about 430 to about 520 nm or about 600 to about 750 nm. For example, the light emitting material could include, but is not limited to: bis[2-(4,6-difluorophenyl)pyridinato-C2,N](picolinato) iridium(III); bis(2,4-difluorophenylpyridinato)tetrakis(1-yrazolyl)borate iridium(III); 4,5-di(9H-carbazol-9-yl)phthalonitrile; or (PCP)Ir(ppy)Cl complex. For some applications, more than one material may be utilized.

When selecting a material for the nanostructure, many materials are envisioned. Preferably, the nanostructure is comprised of at least one dielectric material or plasmonic-material. The material is also preferably selected from the group consisting of a transition metal, an oxide of a transition metal, a post-transition metal, an oxide of a post-transition metal, a metalloid, or an oxide of a metalloid. Even more preferably, the material is Al, Ag, $SiO_2$, $TiO_2$, or ZnO.

Figure 3A:
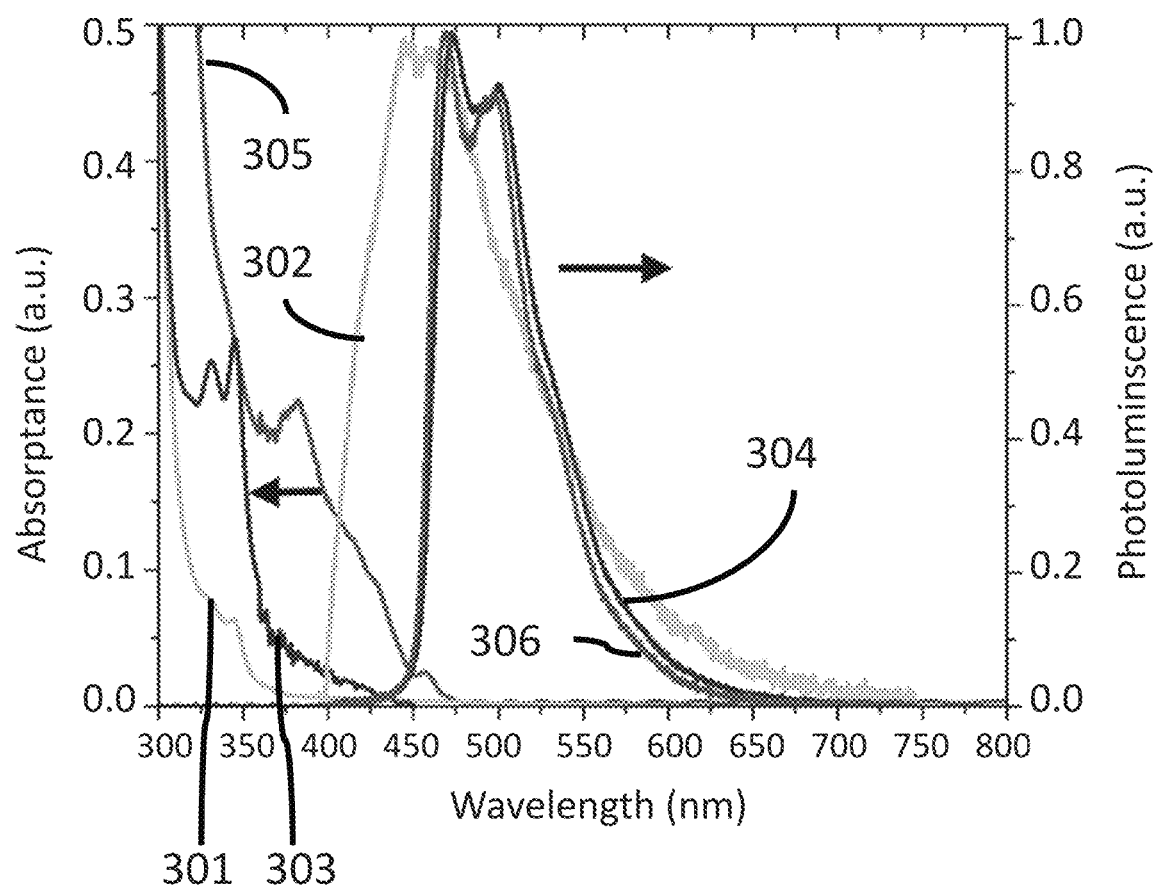
FIG. 3A depicts absorption and photoluminescence spectra of various emitter configurations.
Figure 3B:
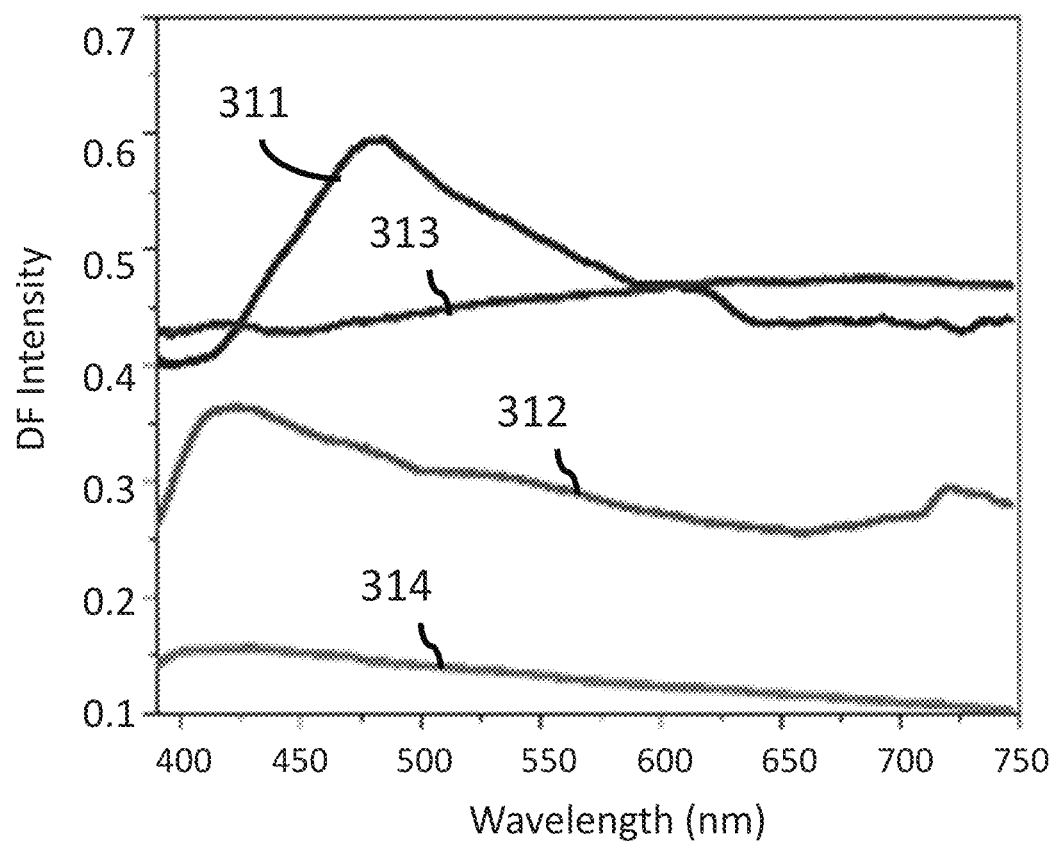
FIG. 3B depicts dark field spectra for various nanostructure configurations.
Figure 3C:
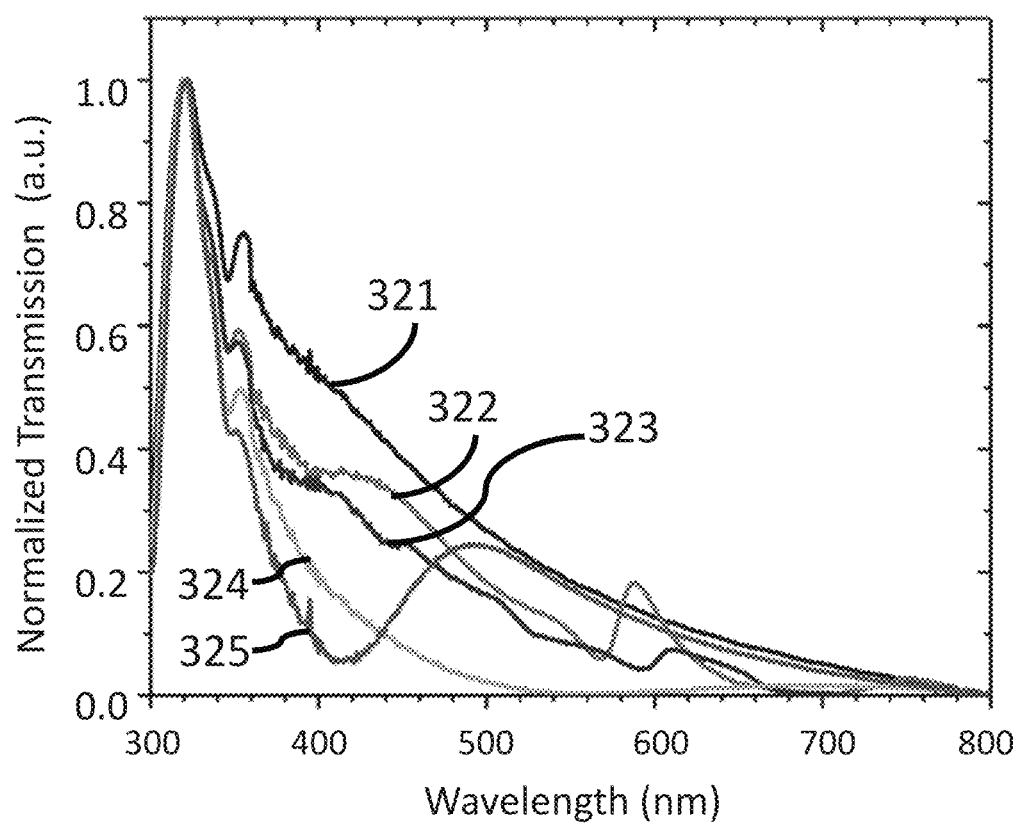
FIG. 3C depicts normalized transmission spectra of PVK: FIrpic-coated Ag metasurfaces.

The light emitting device should also be configured to meet two other criteria. The first criterion is that the nanostructure should be configured (e.g., via the material selection and/or geometry of the nanostructure) such that its local electric field spectrally overlap with the light emitting material (i.e., that the nanostructure can generate strong local electric fields at visible electromagnetic wavelength by means of a localized surface plasmon resonance, an optical cavity or waveguide mode, or Mie or Rayleigh scattering or other similar local electromagnetic/optical effect). FIG. 3A depicts the absorption and photoluminescence spectra of a host PVK, a donor 10 wt % FIrpic, and a blend PVK:FIrpic 20 g/L in chlorobenzene. As shown in FIG. 3A, two light emitter combinations, PVK:FIrpic and FIrpic, have two peak, at 472 nm and 500 nm. In preferred combinations, and as shown in FIG. 3A, there is overlap between a host material (here, PVK) and the light emitting material (here, FIrpic). FIG. 3B shows dark field (DF) spectra for some example nanostructures (1.6 micrometer grating, 0.7 micrometer grating, 60 nm nanoparticles (NPT), and a nanoporous film (NPO). As seen, the spectra in FIG. 3B overlap the spectra in FIG. 3A, to varying degrees.

Figure 4A:
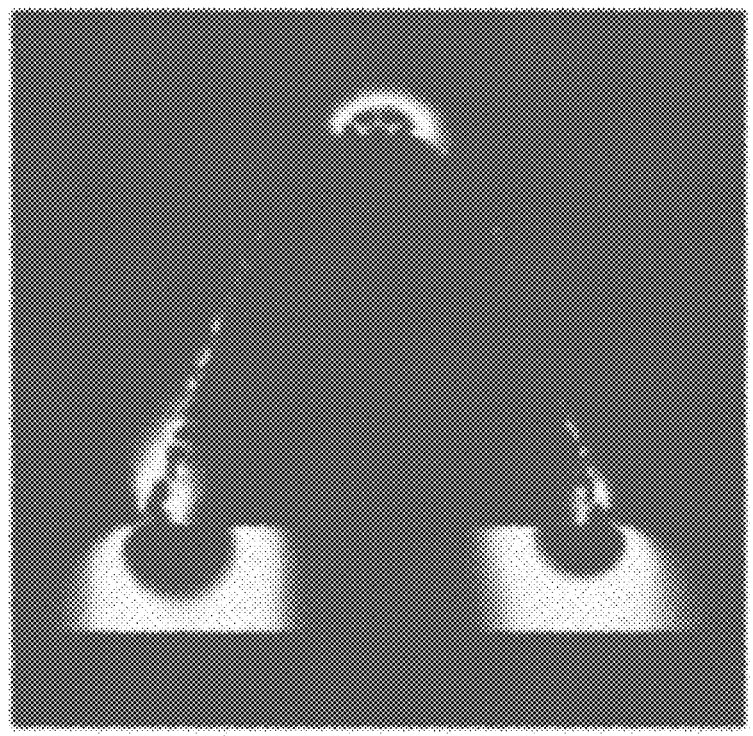
FIG. 4A depicts an electric field intensity profile for a monopole nanoantenna.
Figure 4B:
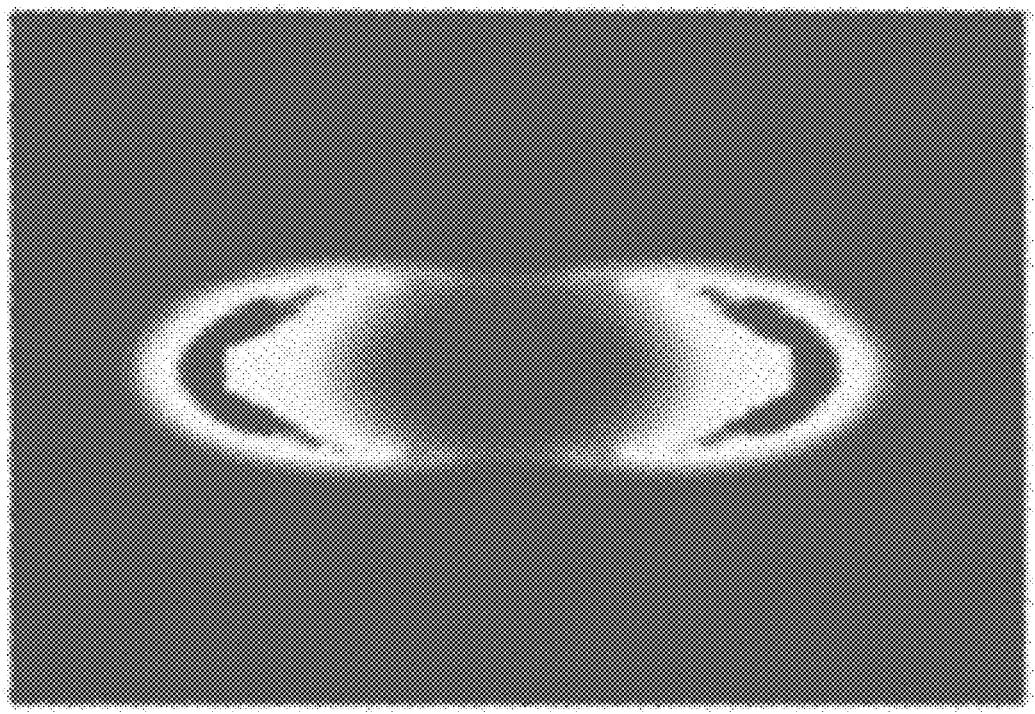
FIG. 4B depicts an electric field intensity profile for a nanorod.
Figure 4C:
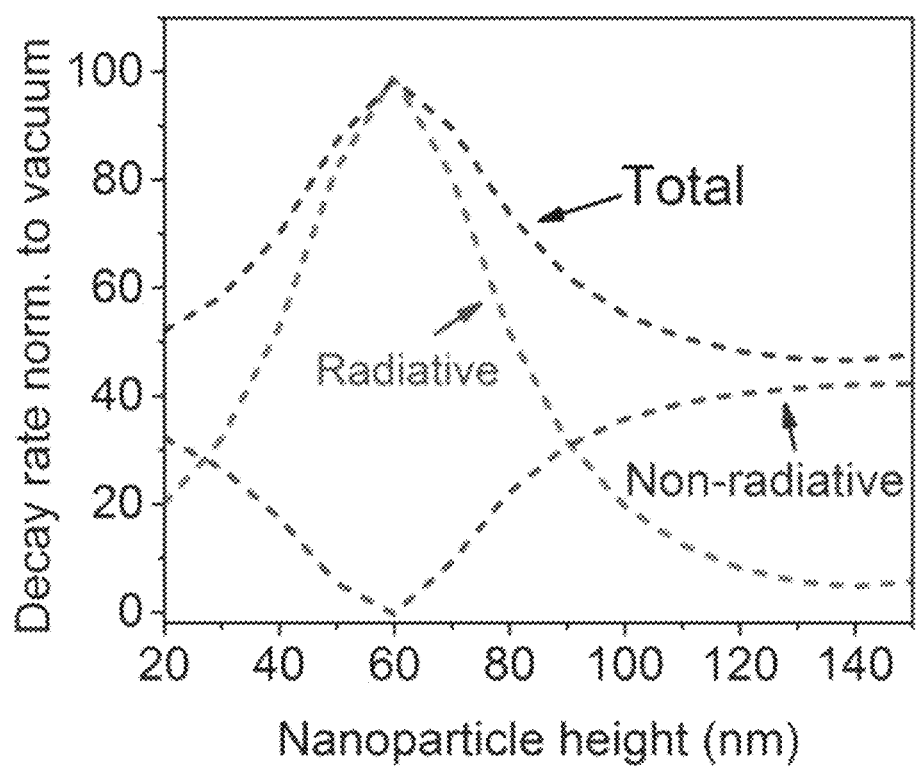
FIG. 4C is a graph depicting radiative decay rate of an emitter at various nanoparticle heights.

The second criterion is that the emitting layer should be configured such that a local optical-frequency (i.e., light) electric field generated by the at least one nanostructure spatially overlaps at least one light emitting organic material. The geometries are expected to exhibit substantial electric field confinement in the light-emitting layer at the wavelength of light emission and thereby provide a large LDOS. FIG. 4A, for example, depicts a simulated electric field profile generated by a monopole nanoantennas at visible wavelengths, similar to the configuration shown in FIG. 2A. Similarly, both plasmonic and dielectric nanorods can exhibit large local electromagnetic field intensities on resonance and, therefore, can provide a large LDOS (See FIG. 4B). Further, electromagnetic simulations of an Au nanoparticle/red emitter/Ag film monopole nanoantenna geometry show significant increases in the radiative decay rate of an emitter at certain nanoparticle heights (See FIG. 4C). Additionally, a minimum in the non-radiative decay rate occurs when the radiative decay rate reaches a maximum due to an efficiently-radiating nanoantenna that is resonantly coupled to the emitter.

When configuring the various devices, analytical electrostatic calculations (Mie Theory) and electromagnetic numerical simulations (solving Maxwell's Equations in 3D) can be carried out to determine the nanostructure material and dimensions and the thickness of the organic phosphorescent layer for optimum spectral and spatial overlap. For example, silver and aluminum were both tested for the nanostructure material, due to their propensity to support intense localized electric fields that can lead to large Purcell enhancements (i.e., radiative decay rate enhancements) in molecules within the local electric field. Nanoparticles of both silver and aluminum exhibited surface plasmon resonances that spectrally overlapped with the emission of the blue organic phosphor FIrpic doped into a polyvinylcarbazole (PVK) conjugated polymer host (PVK:FIrpic; a prototypical host-dopant blend used as the active emissive layer in blue phosphorescent OLEDs). For aluminum, anisotropic nanoparticles with an aspect ratio of, for example, 3.5 were identified as exhibiting a longitudinal surface plasmon resonance that spectrally overlapped with the FIrpic emission band. Other aspect ratios exhibiting similar characteristics were also identified. For silver, single spherical nanoparticles with diameters of 60 nm were identified as exhibiting a surface plasmon resonance at 473 nm in an organic medium with refractive index of 1.9 (similar to that of the PVK:FIrpic). Other nanoparticle dimensions also exhibited similar characteristics. As is known in the industry, the surface plasmon resonance wavelength could be tuned significantly within the blue wavelength range (from 420 nm to 490 nm) by varying the nanoparticle diameter and by tuning the background refractive index to values greater or less than those specified above.

Selected nanostructures can be fabricated using known top-down methods, such as nanoimprint lithography (NIL) and nanotemplating, or known bottom-up methods, such as via polyol synthesis. These methods are preferable because they are compatible with thin-film-format OLED fabrication approaches and can be employed over large, device-relevant areas. Both NIL and nanotemplating can be employed to prepare large-area arrays of nanostructures with controlled dimensions (both on top of and embedded within organic light-emitting layers) from a wide range of dielectric and metallic materials. (See D. M. O'Carroll, C. E. Hofmann, H. A. Atwater. Conjugated polymer/metal nanowire heterostructure plasmonic antennas. *Adv. Mater.* 22, 1223-1227 (2010); S. Y. Chou, P. R. Krauss, P. J. Renstrom, Nanoimprint lithography. *J. Vac. Sci. Technol. B* 14, 4129-4133 (1996); S. Y. Chou, P. R. Krauss, P. J. Renstrom, Imprint lithography with 25-nanometer resolution. Science 272, 85-87 (1996); M. D. Austin, H. Ge, W. Wu, M. Li, Z. Yu, D. Wasserman, S. A. Lyon, S. Y. Chou, Fabrication of 5 nm linewidth and 14 nm pitch features by nanoimprint lithography. *Appl. Phys. Lett.* 84, 5299-5301 (2004); L. J. Guo, Nanoimprint lithography: Methods and material requirements. *Adv. Mater.* 19, 495-513 (2007); J. You, X. Li, F. Xie, W. E. I. Sha, J. H. W. Kwong, G. Li, W. C. H. Choy, Y. Yang, Surface plasmon and scattering-enhanced low-bandgap polymer solar cell by a metal grating back electrode. *Adv. Energy Mater.* 2, 1203-1207 (2012); W. E. I. Sha, X. Li, W. C. H. Choy, Breaking the space charge limit in organic solar cells by a novel plasmonic-electrical concept. *Sci. Rep.* 4, 6236-1-10 (2014); and B. Yu, S. Goodman, A. Abdelaziz, D. M. O'Carroll, Light Management in Ultra-Thin Polythiophene Films using Plasmonic Monopole Nanoantennas. *Appl. Phys. Lett.* 101, 151106 (2012)). The polyol method is a green nanostructure synthesis approach (no toxic chemicals involved), can be applied to multiple material types (metals, semiconductors, metal/dielectric heterostructures), is solution-based which allows integration with solution processable organic luminescent materials and enables nanostructure shape and size to be tuned. (See H. Liang, H. Yang, W. Wang, J. Li, H. Xu, High-yield uniform synthesis and microstructuredetermination of rice-shaped silver nanocrystals. *J. Am. Chem. Soc.* 131, 6068-6069 (2009); H. Liang, H. Zhao, D. Rossouw, W. Wang, H. Xu, G. A. Botton, D. Ma, Silver nanorice structures: oriented attachment-dominated growth, high environmental sensitivity, and real-space visualization of multipolar resonances. *Chem. Mater.* 24, 2339-2346 (2012); S. Coskun, B. Aksoy, H. E. Unalan, Polyol Synthesis of Silver Nanowires: An Extensive Parametric Study, *Cryst. Growth Des.* 11, 4963-4969 (2011); B. J. Wiley, Y. Chen, J. M. McLellan, Y. Xiong, Z.-Y. Li, D. Ginger, Y. Xia, Synthesis and Optical Properties of Silver Nanobars and Nanorice. *Nano Lett.* 7, 1032-1036 (2007); B. W. Chieng, Y. Y. Loo, Synthesis of ZnO nanoparticles by modified polyol method. Mater. Lett. 73, 78-82 (2012); E. Uchaker, N. Zhou, Y. Li, G. Cao, Polyol-Mediated Solvothermal Synthesis and Electrochemical Performance of Nanostructured V2O5 Hollow Microspheres. *J. Phys. Chem. C* 117, 1621-1626 (2013); R. Genç, G. Clergeaud, M. Ortiz, C. K. O'Sullivan, Green Synthesis of Gold Nanoparticles Using Glycerol-Incorporated Nanosized Liposomes. *Langmuir* 27, 10894-10900 (2011); C. W. Kim, H. G. Cha, Y. H. Kim, A. P. Jadhav, E. S. Ji, D. I. Kang, Y. S. Kang, Surface Investigation and Magnetic Behavior of Co Nanoparticles Prepared via a Surfactant-Mediated Polyol Process. *J. Phys. Chem. C* 113, 5081-5086 (2009); and J.-M. Lee, D.-W. Kim, Y.-D. Jun, S.-G. Oh, Preparation of silica-silver heterogeneous nanocomposite particles by one-pot preparation strategy using polyol process: Size controlled immobilization of silver nanoparticles. *Mater. Res. Bull.* 41, 1407-1416 (2006)).

The Ag nanoparticles were synthesized using seed-mediated solution synthesis and had a coating of polyvinyl pyrrolidone (PVP). The PVP coating allowed the Ag nanoparticles to be dispersed in ethanol and also the PVP coating enabled exhibit a strong electrostatic attraction to the PAA layer on glass. Additionally, the PVP coating enabled discrete Ag nanoparticles to be obtained with controllable density on glass.

Exciton-plasmon coupling in core-shell Ag-organic nanoparticles was also investigated using numerical electromagnetic simulations, to identify the evanescent decay length of the local electric fields around the Ag nanoparticles and a suitable thickness for the organic coating (or shell) for which there is optimum interaction with the local electric fields. The theoretical simulations showed that for a fixed nanoparticle size the electric fields were localized within 30 nm of the nanoparticle surface (e.g., absorption enhancement is optimized in the shell). This is the region in which the Purcell effect is expected to be greatest (i.e., strongest radiative recombination rate enhancement), particularly when the localized surface plasmon resonance wavelength of the Ag nanoparticle is tuned to emission wavelength of the organic shell. Furthermore, it is clear from the significant plasmonic splitting arising from coupling between the resonance of the Ag nanoparticle and the organic semiconductor shell (modelled using the Lorentz oscillator model) that strong exciton-plasmon coupling can be achieved in this structure which is also an indicator that a strong Purcell effect will be possible.

As one example of an embodiment of the present invention, a polymer was first prepared. Here, a host poly(N-vinylcarbazole) (PVK) with the blue phosphorescent dopant, bis[2-(4,6-difluorophenyl)pyridinato-$C^2$,N](picolinato) iridium(III) (FIrpic) which are commonly used in organic light-emitting diodes (OLEDs). This host-dopant matrix has been shown to improve light out coupling and enhance triplet excitation because the host assists in charge transport and excitation energy transfer, while the dopant provides color and increases intersystem crossing which improves the internal quantum efficiency. A blend solution containing the host and dopant was spin coated onto five different Ag metasurfaces: planar silver, periodic nanoimprinted silver gratings (1.6 μm pitch 1D grating and 0.7 μm pitch 1D grating) (see FIG. 2E), aperiodic nanoporous (NPO) silver (see FIG. 2D), and aperiodic nanoparticle (NPT) silver (see FIG. 2B).

To prepare thin films of poly(N-vinylcarbazole) (PVK) containing the blue phosphorescent dopant, bis[2-(4,6-difluorophenyl)pyridinato-C2,N](picolinato)iridium(III) (FIrpic), first, a host:dopant solution of PVK:FIrpic, was prepared in either a 19:1 ratio (S1) or a 9:1 ratio (S2) (i.e., 10 wt % dopant concentration) to create a 20 g/L solution. For S1, PVK (0.019 g) was added to 1 mL of FIrpic stock solution (0.2 g FIrpic dissolved in 200 mL of chlorobenzene). For S2, PVK (0.3604 g) and 0.0404 g FIrpic was dissolved in 10 mL of chlorobenzene. 5 mL of each were then added into a glass vial to prepare the PVK:FIrpic solution. The 9:1 host:dopant ratio is more consistent with what has been previously shown in the literature for PVK:FIrpic thin films. The solution was prepared in an amber 2 mL glass vial for S1 and 15 mL beaker for S2 that contained a 5 mm×2 mm polytetrafluoroethylene (PTFE)-coated magnetic stirring rod which assisted in dissolution of the solid. The solution was placed in a water bath on a hotplate and heated to 40° C. with 1000 rpm spin speed for 10 minutes so that the PVK would fully dissolve into the solution. The same method was used to dissolve the FIrpic in chlorobenzene. The PVK:FIrpic solution was then used to prepare PVK:FIrpic thin-film samples to be characterized for sample thickness using the following steps. First, glass microscope slides were cut into approximately 1 cm×1 cm pieces, and cleaned with the standard glass cleaning procedure as follows: immersed in SPARKLEEN™ detergent solution (from a stock solution of 5 g SPARKLEEN™ detergent powder in 2 L of deionized (DI) water), sonicated for 15 minutes, rinsed in DI water 3 times, submerged in 50:50 hydrochloric acid and ethanol solution (approximately 60 mL) for 15 minutes, rinsed in DI water 3 times, and dried using an air gun. Then, 50 μL of the 19:1 PVK:FIrpic solution was spin coated onto the glass substrates. Spin coating parameters such as concentration, spin speed, spin time, and the amount of solution injected onto the substrate were varied to determine the optimal dynamic spin coating parameters. These were 50 μL drop volume, 20 g/L total concentration, 1000 rpm spin speed, 30 s spin time for S1 and 100 μL drop volume, 20 g/L total concentration, 2000 rpm spin speed, 25 s spin time for S2. Spin coating was used because this method is cheaper, more commercializable, uses less energy, and does not waste as much organic material as thermal evaporation. Following spin coating, these samples were annealed at 80° C. for 30 min on a hot plate in ambient conditions to remove residual solvent.

The aforementioned PVK:FIrpic solution and spin coating parameters were then used to prepare five PVK:FIrpic thin film samples on differing silver (meta)surfaces: planar silver, nanoimprinted 1D Ag gratings with 1.6 μm pitch and 0.7 μm pitch (see FIG. 2E), aperiodic nanoporous (NPO) silver (see FIG. 2D), and aperiodic nanoparticle (NPT) silver (see FIG. 2B). The samples were passivated by bonding a thin glass cover slip to the PVK:FIrpic sample side with UV-curable optical epoxy (Norland 63) in order to reduce photooxidation and photobleaching which can lead to degradation of the PVK:FIrpic emission. For S1, after passivating, the samples were annealed at 80° C. for 30 min. on a hot-plate under ambient conditions with the film side facing up to promote further crosslinking in phosphorescent emitter. However, for S2 post annealing was not carried out after passivating with optical epoxy because the anneal step was found to degrade the PVK:FIrpic emission and to potentially change in phosphorescent emitter morphology.

The PVK:FIrpic thickness was determined from an analysis of the absorption spectra of planar PVK:FIrpic films on glass substrates obtained using a SI Photonics CCD Array UV-visible absorption spectrometer. To extract film thickness from absorption spectra, an adapted version of Beer-Lambert's law for solids was employed which consisted of the following equations: $A=\log[1/T]$; $x=\ln[T]/-\alpha$ and $\alpha=4\pi k/\lambda$, where $\alpha$ is the absorption coefficient, A is absorbance, T is transmittance, x is PVK:FIrpic film thickness, and k is the imaginary part of the refractive index (i.e., extinction coefficient). Using these equations, the measured absorbance spectra and $\alpha=46{,}675.1$ cm$^{-1}$ from the literature, the PVK:FIrpic samples were found to have a thickness of 87 nm±3.5 nm for S1 (which were confirmed with atomic force microscopy (AFM) measurements) and 62 nm±8.1 nm for S2.

The Ag metasurfaces were prepared using the following nanofabrication methods. Nanoimprint lithography was employed for fabrication of 1D Ag gratings with 1.6 μm and 0.7 μm pitch. A polydimethylsiloxane (PDMS) silicone elastomer with a base to curing ratio of 10:1 was created through constant mixing to ensure effective crosslinking. Then a cleaned 1.6 μm and 0.7 μm grating disk from a CD or DVD was placed into a petri dish with the viscous PDMS and annealed in an ambient condition oven at 130° C. for 30 minutes. Once cooled the petri dish was removed from the oven and the PDMS mold was removed from the petri dish and cut into 2 cm×2 cm squares. A poly (methyl methacrylate) (PMMA) resist was created by spin coating PMMA solution onto clean coverslip glass with the following spin coating parameters: 6000 revolutions per minutes, 60 seconds, and 20 μL. The PDMS 2 cm×2 cm mold was then placed onto the PMMA cover slip glass with imprint side face down to ensure grating transfer. The PDMS mold/PMMA cover slip was then placed on a metal slab with an additional metal slab with weights placed on top. It was then placed back into the ambient conditions oven and annealed at 170° C. for 2.5 hours. Once cooled it was removed and was prepared for metal evaporation. Ag was thermally evaporated to a thickness of 50 nm on the PMMA gratings on glass to create the 1D Ag grating metasurfaces.

Thermally-assisted dewetting of silver thin films was employed for the fabrication of NPO and NPT Ag metasurfaces with an effective thickness of 100 nm of silver for S1 and 50 nm of silver for S2. The NPO were fabricated through the following method: 50 nm or 100 nm of Ag was thermally evaporated onto a cover slip glass and the Ag cover slip was placed in an argon filled glovebox; annealed at 200° C. for 20 minutes; and then cooled to room temperature. For NPT Ag for S1, a 100 nm thick Ag film was thermally evaporated onto a glass cover slip and the Ag cover slip was placed into argon glovebox. It was then annealed at 540° C. for 5 minutes to form nanoparticles and then allowed to cool to room temperature. After which it was removed from the glovebox. For NPT Ag for S2, initially, 10 nm of Ag was thermally evaporated onto a glass cover slip and the Ag-covered substrate was placed into an argon filled glovebox. It was then annealed at 540° C. for 5 minutes to form nanoparticles and then allowed to cool to room temperature. After which it was removed from the glovebox and then 40 nm of Ag was thermally evaporated onto the substrate.

While the metasurfaces fabrication methods remained the same for S1 and S2 except for the NPT films, in S2 the volume of metal used to fabricate the metasurfaces was kept consistent across all samples to an effective thickness of 50 nm. This was done in order to minimize back reflections and maintain a similar metasurfaces transmittance, thus reducing the impact metallic film thickness may have on PL spectral results. For all sample types, the silver metasurface quality and uniformity was investigated with both scanning electron microscopy (SEM) and reflection-mode, dark-field (DF) optical microscopy. Further, UV-visible transmission and DF spectra were used to investigate the optical response of each Ag metasurface.

The characteristic absorption and normalized PL spectra for thin films of neat PVK (301, 302, respectively), FIrpic (305, 306, respectively) and the PVK:FIrpic blend (303, 304, respectively) on glass are shown in FIG. 3A. The photoluminescence spectrum of PVK:FIrpic (304) follows the characteristic FIrpic spectrum (306) exhibiting two peaks at 472 nm and 500 nm, thus signifying proper energy transfer from the host, PVK, to the dopant, FIrpic. The peak absorption intensity of PVK (301) is at approximately 350 nm, which is slightly shifted from, the expected PVK peak at a wavelength of 342 nm. However, there is spectral overlap of the absorption spectrum of the dopant, FIrpic (306), and the photoluminescence spectrum of the host, PVK (301), in the wavelength range between 400 nm to 470 nm, which accounts for efficient energy transfer. After investigating the spectral properties of each organic thin film, the metasurface substrates were characterized using scanning electron microscopy (SEM), dark-field (DF) optical microscopy, and UV-visible transmission spectroscopy (FIG. 1-2).

Upon completion of the sample fabrication and optimization, photoluminescence (PL) spectroscopy was used to measure the stability of PVK:FIrpic films on various (meta) surfaces by recording the PL intensity every 2 min. for a total of 30 min. These PL stability measurements were performed with 355 nm laser excitation and a 400 nm long pass filter in the collection optical path. The typical laser power density and repetition rate were approximately 1500 mW/cm$^2$ and 1000 Hz but were varied somewhat to obtain a particular luminance at the sample. The appropriate laser power density and repetition rate required to obtain a particular luminance was calculated using the photopic spectral luminous efficiency curve. A non-linear regression fit to the photopic spectral luminous efficiency curve experimental data yields the approximation:

$$V(\lambda) = 1.019 e^{-285.4(\lambda - 0.559)^2} \quad (1)$$

where, $V(\lambda)$, is the photopic spectral luminous efficiency and the wavelength, $\lambda$, is in micrometers. We then calculated the luminance, B (in cd/m$^2$), at a wavelength of 450 nm as follows:

$$B = V(\lambda) * n_{PL} * P_w * 683 * \pi \quad (2)$$

where $(n_{PL})$ is the PL quantum efficiency of PVK:FIrpic (chosen to be a value of 51%), $P_w$ is the average laser power in W/m$^2$. The constant 683 converts Watts to lumens and the factor $\pi$ converts lumens to candela. The target was a luminance of 1000 cd/m$^2$ due to the current stability and lifetime testing targets of OLEDs on the market. The PL spectra were acquired using a ANDOR™ Shamrock SR 303i imaging spectrometer with 50 accumulations, and the exposure time for each accumulation was 0.02 s for a 1 s total exposure time. The average laser power, $P_w$, reading was taken during each spectral acquisition step to account for laser fluctuations with time. Planar PVK:FIrpic film on glass and on planar silver were used as control samples. The intensity of the 0-1 excitonic transition from the FIrpic emission was extracted from the PL spectra and plotted versus time and then divided by the laser power recorded for each respective PL spectrum. The final PL spectra were intensity normalized to the highest PL peak intensity value.

Transient PL lifetime measurements were then completed to determine the mechanism behind the stability changes. The PL lifetime decay curves of passivated samples were measured using a FluoTime 200 spectrometer (PicoQuant). A 375 nm laser beam (Spectra-Physics MaiTai BB Ti:Sapphire laser (pulse width<80 ps) with a frequency doubler) was used as excitation source. The incident and collection angles were 45° with regards to sample surface. The laser repetition rate was set as 400 kHz. A 410 nm long-pass filter was placed in the optical collection path. The emission at 470 nm was detected by applying a monochromator before the detector (MCP-PMT type, Hamamatsu, 45 ps response time) (FIG. S2). The decay data were recorded using a TimeHarp 260 NANO (PicoQuant) working in time-correlated single photon counting (TCSPC) mode with 250 ps time resolution. The acquired data were then analyzed in FluoFit software (PicoQuant) to get the PL lifetime decay constants of each sample.

The 1.6 μm and 0.7 μm 1D Ag gratings, NPT Ag, and NPO Ag metasurfaces were all chosen due to their potential to increase light emission of PVK:FIrpic through resonant light scattering or through local electric-field enhancement at the emission wavelength. The SEM images of the metasurfaces show uniform pattern transfer for the 1D Ag gratings with the 1.6 μm gratings larger in size than 0.7 μm gratings (FIG. 1). Both 1D Ag gratings have granular Ag films. The NPT Ag metasurfaces have dense (~10 particles per μm$^2$), quasi-hemispherically-shaped nanoparticles on their surface with a diameter ranging between 10 nm and 100 nm. The NPO Ag metasurfaces had sparse (~1 pore per μm$^2$), irregularly-shaped pores, approximately 50 nm to 200 nm in size, and the Ag regions between the pores had a polycrystalline appearance with Ag grains ~200 nm in size. The transmittance spectra of the Ag surfaces show peaks from 300 nm to 350 nm due to bulk plasma frequency of Ag (FIG. 2*b*). All metasurfaces exhibited reduced transmission compared to the planar Ag and showed shoulders or peaks distributed across the visible spectrum due to plasmonic and grating modes. The NPT transmittance spectrum exhibited a pronounced dip at ~410 nm and a distinct peak at ~490 nm attributed to localized surface plasmon resonances of the nanoparticles.

Figure 5:
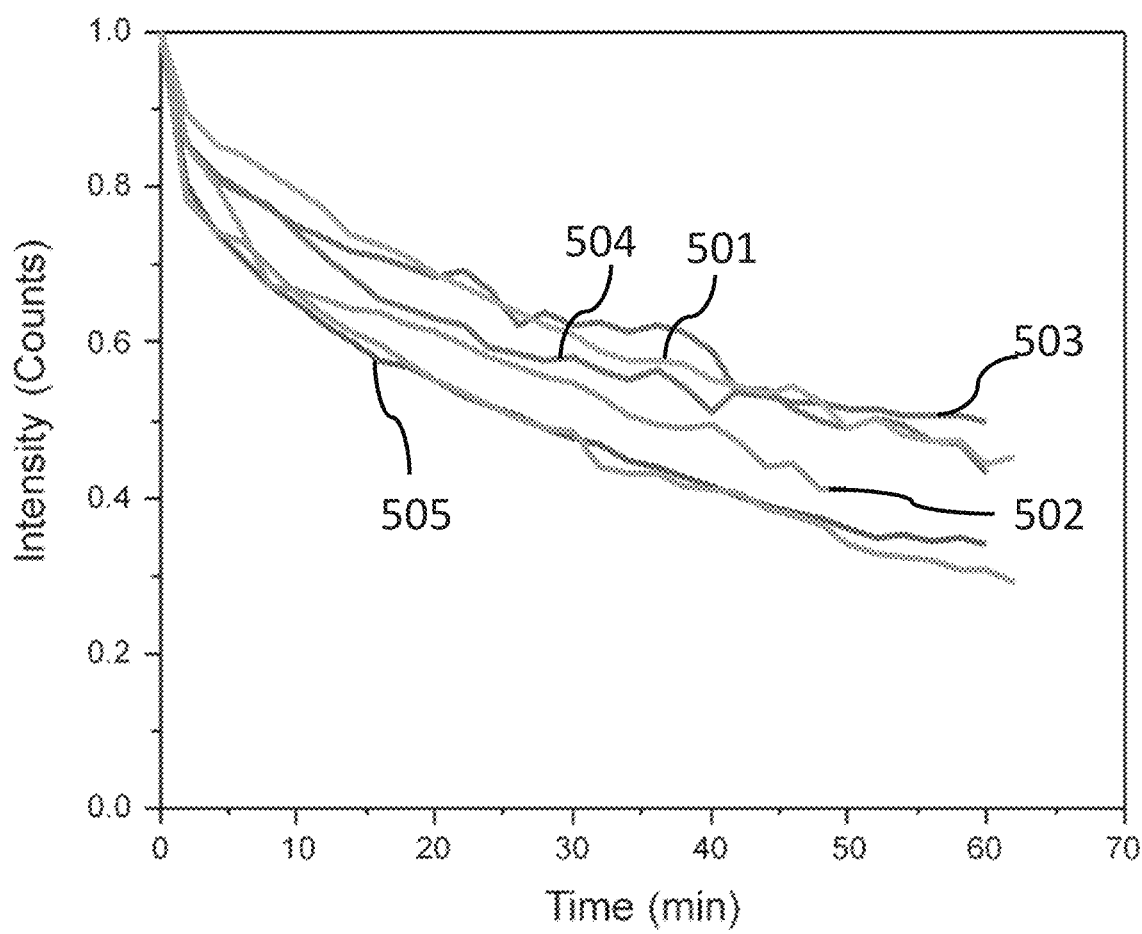
FIG. 5 is a graph depicting accelerated PL stability testing of PVK:FIrpic thin films on various substrates.

The initial investigation of the polymer blend and metasurface substrates suggested that the 1.6 μm and 0.7 μm 1-D Ag gratings or NPT Ag would provide the greatest enhancement due to the spectral overlap of scattering with the emission from the PVK:FIrpic blend. However, stability testing was completed for PVK:FIrpic thin films on the following substrates: glass, planar Ag, 1.6 μm and 0.7 μm 1-D Ag gratings patterns, NPT Ag and NPO Ag in order to confirm that hypothesis. Referring to FIG. 5, the PL stability results show that the emission from PVK:FIrpic on the NPT Ag (501, 502), the 0.7 μm 1-D Ag grating (503) and the 1.6 μm 1-D Ag grating (504) were more stable relative to that on the planar Ag film (Ref. 505), with an increased half-life, $L_{50}$, (i.e., time to reach 50% of the initial PL intensity). For this stability testing, all samples were continuously exposed to focused UV light. The 1-D Ag gratings were on a PMMA/glass substrate. The planar Ag and the Ag gratings all had 50 nm-thick silver films, while the NPO and NPT were fabricated by dewetting from 50 nm-thick silver films. All samples were spin coated with 20 g/L of PVK:Firpic yielding a film thickness of ~100 nm. The luminance at the sample is 100,000 cd/m$^2$.

These $L_{50}$ changes represent enhancements in stability by factors of 1.9 and 2.2 for NPT and 1-D Ag grating (1.6 μm), respectively. Although these metasurfaces resulted in stability enhancements relative to planar Ag, the stability was reduced by a factor of 2 relative to PVK:FIrpic on glass. The reduced stability on metal substrates compared to glass stems from the measurement geometry whereby there was increased excitation power in the PVK:FIrpic on metal samples due a double pass of the excitation light back into the PVK:FIrpic thin film due to reflected excitation light that was not absorbed on the first pass through PVK:FIrpic. It should be noted that within optoelectronic devices, PVK:FIrpic thin films will be in the presence of metallic electrode surfaces thus the stability comparison with PVK:FIrpic on planar Ag rather than on glass is more appropriate. When making comparisons across sample sets and trails, we see that for the 1-D Ag gratings and NPT Ag consistently result in the most stable PVK:FIrpic emission, with average stability enhancements factors of ~2 and with a maximum observed stability enhancement factor of 4.4.

Transient PL lifetime testing for PVK:FIrpic on each Ag metasurface type was used to determine if enhanced PL stability correlates with enhanced PL lifetime. Table 1, below, shows the average PL lifetime T ($\tau_{average}$), intensity at time, t,=0, shortest PL lifetime decay component ($\tau_1$), longer PL lifetime decay component ($\tau_2$), and the longest PL lifetime decay component ($\tau_3$) for PVK:FIrpic thin films on glass, planar Ag, 1.6 μm 1-D Ag grating and 0.7 μm 1-D Ag grating patterned, NPT and NPO nanostructured Ag metasurfaces. The PL lifetime components were extracted from fits to the data using a second or third order exponential decay function. Planar Ag and 1D Ag gratings had an underlying glass coverslip or PMMA/glass coverslip as the substrate. Overall, PVK:FIrpic thin films on metallic surfaces shortens the average PL lifetime, $\tau_{avg}$, by a factor of 2.8 compared to on glass (Table 1). The long average PL lifetime decay constant ($\tau_{avg}$=0.96 μs) of PVK:FIrpic when on glass can be attributed primarily to the natural phosphorescence lifetime decay of the dopant FIrpic. The results show in all cases that there are fast and slow lifetime decay time constants which contribute to the overall shape of the decay curves (FIG. 4) (i.e., PL lifetime decay curves were best fit with double or triple exponential decay functions).

TABLE 1

| Substrate | $\tau_{average}$ (microsec) | Intensity at peak intensity | $\tau_1$ (microsec) | $\tau_2$ (microsec) | $\tau_3$ (microsec) | $\chi^2$ |
|---|---|---|---|---|---|---|
| Glass | 0.963 | 477 | 0.1717 (24.71%) | 1.0073 (75.29%) | | 0.931 |
| Planar Ag ($2^{nd}$ order) | 0.4362 | 2333 | 0.29867 (73.53%) | 0.62014 (26.47%) | | 0.981 |
| Planar Ag ($3^{rd}$ order) | 0.44553 | 2333 | 0.1512 (24.11%) | 0.41827 (73.14%) | 1.0858 (2.74%) | 0.871 |
| 1-D Ag Grating (1.6 μm) | 0.79503 | 6186 | 0.0670 (31.87%) | 0.46180 (53.81%) | 1.3167 (14.32%) | 1.014 |
| 1-D Ag Grating (0.7 μm) | 0.63587 | 2608 | 0.07214 (40.10%) | 0.41241 (49.32%) | 1.1455 (10.58%) | 1.019 |
| NPT Ag | 0.34089 | 15319 | 0.03933 (43.13%) | 0.21612 (42.16%) | 0.54607 (14.71%) | 0.957 |
| NPO Ag | 0.42423 | 8222 | 0.05305 (21.26%) | 0.31489 (59.08%) | 0.62410 (19.66%) | 1.038 |

PL lifetime curves were also created of the PVK:FIrpic thin films on various substrates. A 372-nm laser was employed for the PL lifetime measurements. The 1.6 μm 1-D Ag grating, 0.7 μm 1-D Ag grating were all on a PMMA/glass substrate with silver thin films. The planar silver, 1.6 μm grating, and 0.7 μm grating all had 50 nm thick silver films, while the NPO and NPT were fabricated by dewetting from 50 nm thick silver films. All samples were spin coated with 20 g/L of PVK:FIrpic yielding a film thickness of ~100 nm.

The PL lifetime of PVK:FIrpic on planar Ag have two components with time constants of 0.3 μs and ~0.6 μs. There is a new fast initial exponential decay on 0.7 μm and 1.6 μm 1-D Ag gratings ($\tau_1 \approx 0.07$ μs) and an even faster initial decay on NPT metasurfaces ($\tau_1 \approx 0.04$ μs), not observed on planar Ag, which contribute significantly to the average PL lifetime (30%-43%). This fast component is also observed on NPO but it has a less significant contribution to the average lifetime (21%). The second slower lifetime component on NPT ($\tau_2 \approx 0.2$ μs), NPO ($\tau_2 \approx 0.3$ μs), 0.7 μm ($\tau_2 \approx 0.4$ μs) and 1.6 μm 1-D Ag gratings ($\tau_2 \approx 0.5$ μs) are approximately the same time scale as the initial PVK:FIrpic on planar Ag time constant ($\tau_1 \approx 0.3$ μs), accounting for 40-60% of the average PL lifetime. However, while the longest component for the PVK:FIrpic on NPT and NPO ($\tau_3 \approx 0.6$ μs) is the same as the second PVK:FIrpic on planar Ag time constant ($\tau_2 \approx 0.6$ μs), the time constant for the PVK:FIrpic on 0.7 μm and 1.6 μm 1-D Ag gratings ($\tau_3 \approx 1$ μs) is much longer, possibly due to emitter-metal non-radiative interactions. As a result, the average PL lifetime is shortened for the PVK:FIrpic on NPT ($\tau_{avg} \simeq 0.3$ μs) and approximately the same for the PVK:FIrpic on NPO ($\tau_{avg} \simeq 0.4$ μs), while it is lengthened for PVK:FIrpic on 0.7 μm ($\tau_{avg} \simeq 0.6$ μs) and 1.6 μm ($\tau_{avg} \simeq 0.8$ μs) 1-D Ag gratings, respectively relative to planar Ag ($\tau_{avg} \simeq 0.4$ μs).

In the transient PL lifetime data, at peak intensity, there is an increased PL intensity compared to PVK:FIrpic on planar Ag for PVK:FIrpic on all Ag metasurface cases on NPO; 8,222 counts on NPT, 15,319 counts on 0.7 μm 1-D Ag grating, and 2,608 counts on 1.6 μm 1-D Ag grating relative to 6,186 counts μs for PVK:FIrpic on planar Ag. The PL intensity enhancement can be a be measure of quantum efficiency enhancement, $E_{PL}$, assuming all radiated PL is collected by the measurement optics. The $E_{PL}$ relative to planar Ag is 6.6 on NPT, 3.5 on NPO, 1.1 on 0.7 μm 1-D Ag grating, 2.7 on 1.6 μm 1-D Ag grating. Further, quantum yield (QY) spectra were obtained for Sample Set 1 with the sample excitation wavelength and sample configuration as for the PL stability measurements. The QY values trend with $E_{PL}$ in that the QY on planar Ag increases relative to glass (~22% to 31%, respectively). In addition, QY increases for 1-D Ag Grating (0.7 μm), but decreases for NPO Ag relative to planar Ag (~48% and ~25%, respectively).

PVK:FIrpic on Ag grating and NPT metasurfaces exhibits improved phosphorescence stability relative to the PVK:FIrpic on planar Ag, with the most intense and rapid PL lifetime, as well as most enhancement quantum efficiency occurring for the NPT metasurfaces. Therefore, in the case of the PVK:FIrpic on NPT metasurface there is a correlation between enhanced stability and shortened PL lifetime relative to the PVK:FIrpic on planar Ag. See Table 2, below. (Table 1).

TABLE 2

| Substrate Type | $L_{50}$ (min.) | | | $\tau_{PL}$ (μs.) | $E_{PL}$ | QY (%) |
| --- | --- | --- | --- | --- | --- | --- |
| | S1T1* | S2T3* | S2T4+ | S2 | S2 | S1 |
| Glass | 9.48 | 2.42 | — | 0.96 | 0.20 | 22.4 ± 8.6 |
| Planar Ag | 1.00 | 1.00 | 1.00 | 0.44 | 1 | 31.2 ± 7.6 |
| 1-D Ag Grating (1.6 μm) | 4.43 | 0.72 | 2.15 | 0.80 | 2.65 | — |
| 1-D Ag Grating (0.7 μm) | 1.30 | 1.02 | 1.84 | 0.64 | 1.12 | 48 ± 6.6 |
| NPT Ag | 4.26 | 1.51 | 1.93 | 0.34 | 6.57 | — |
| NPO Ag | 1.30 | 0.58 | 1.00 | 0.42 | 3.52 | 24.6 ± 6.5 |

Table 2 captures the stability enhancement (i.e., enhancement in the half-life ($L_{50}$)), average PL lifetime ($\tau_{avg}$), and PL intensity enhancement ($E_{PL}$) of PVK:FIrpic on various substrate types. Stability data is reported for measurements carried out on different sets of samples (i.e., "Sets") and on different days ("Trials") to check the repeatability of the data. Representative results from different Sets and Trails are shown, as follows: Sample Set 1 Trial 1 (S1T1), Sample Set 2 Trial 3 (S2T3) and Sample Set 2 Trial 4 (S2T4). The various substrate types are glass, planar Ag, 1.6 μm 1-D Ag grating and 0.7 μm 1-D Ag grating patterned metasurfaces, and NPT and NPO nanostructured metasurfaces. Two different luminances were employed for the stability measurements: 10,000 cd/m² (indicated by (*)) and 100,000 cd/m² (indicated by (+)) which were determined from the measured excitation power densities. The PL quantum yield (QY) for Sample Set 1 for PVK:FIrpic thin films on glass, planar Ag, 1.6 μm 1-D Ag grating and 0.7 μm 1-D Ag grating patterned, NPT and NPO nanostructured Ag metasurfaces Planar Ag and 1D Ag gratings had an underlying glass coverslip or PMMA/glass coverslip as the substrate.

One skilled in the art will recognize that these devices and methodologies may also be use in applications outside of lighting. For example, bioimaging, especially via the use of Iridium (III) complexes, can benefit from these stabilization techniques. Similarly, these devices and techniques and can configured for use in wide variety of other fields, including but not limited to photochemistry and single molecule spectroscopy.

Planar Embodiments. To simplify the discussion of the various embodiments, these embodiments have generally been described within the context of a planar embodiment such as a layered structure wherein at least one organic material radiative in an emission band (visible or non-visible) is positioned proximate at least one nanostructure configured to have local electric fields at wavelengths that spectrally and spatially overlap with said emission band of said radiative organic material. That is, a planar structure is used to support and/or configure the spatial positions of the organic material(s) and the nanostructure(s) such that the interactions therebetween occur in the manner described above.

Non-Planar Embodiments. In addition to the planar embodiments described above, various non-planar embodiments are also provided. Briefly, such embodiments may comprise various non-planar structures such as particles, fluids, droplets and the like such as may find utility within the context of electrochemical sensors, biosensors, biophotonic devices and the like. For example, some embodiments may utilize an emitting material coated around, or attached to, the nanostructure, where the emitting material and nanostructure are combined to form a hybrid nanoparticle structure. This hybrid nanoparticle structure provides the enhanced triplet exciton emission stability, via the spatial and spectral overlap of local electric fields of nanoparticle and emitting material. Further, both planar and non-planar structures may be selected as entireties, regions, sub-regions and so on. Various nanostructures may utilize fluid adherence mechanisms maintain an operational disposition between organic material(s) and the nanostructure(s).

In both planar and non-planar embodiments, one or more substrate materials may be used to support and/or configure the spatial positions of the organic material(s) and the nanostructure(s) such that the interactions therebetween occur in the manner described above. The one or more substrate materials may comprise rigid structures to which one or both of the organic material(s) and the nanostructure(s) are adhered to or otherwise urged toward an operative physical disposition with respect to each other via direct physical connection, electromagnetic forces, fluid surface tension and/or other mechanisms.

In both planar and non-planar embodiments, the organic material(s) and the nanostructure(s) may themselves physically cooperate to support and/or configure their respective spatial position such that the interactions therebetween occur in the manner described above. In various embodiments the organic material(s) and the nanostructure(s) may be operatively disposed proximate to each other, one inside the other and so on.

Thus, in various other embodiments, the term "layer" as used in the above discussion may be replaced by the terms "region" or "area" or "portion" to indicate thereby such that both planar and non-planar structures, or portions thereof, are contemplated to be within the scope of the instant disclosure.

Thus, specific devices and systems utilizing nanostructures to engineer the extrinsic radiative decay rate of organic light emitting materials have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. In addition, the references listed herein are also part of the application and are incorporated by reference in their entirety as if fully set forth herein.

What is claimed is:

1. A device, comprising:
   at least one substantially planar organic layer having an organic or organometallic material radiative in an emission band and having at least one nanostructure configured to have local electric fields at wavelengths that spectrally and spatially overlap with said emission band of said radiative organic material.

2. The device according to claim 1, wherein at least one organic or organometallic material comprises a light emitting organic material capable of emitting via at least one pathway selected from the group consisting of phosphorescence or thermally-assisted delayed fluorescence.

3. The device according to claim 1, wherein at least one nanostructure is comprised of a material selected from the group consisting of a transition metal, an oxide of a transition metal, a post-transition metal, an oxide of a post-transition metal, a metalloid, or an oxide of a metalloid.

4. The device according to claim 3, wherein the nanostructure is comprised of a material selected from the group consisting of Al, Ag, $SiO_2$, $TiO_2$, or ZnO.

5. The device according to claim 1, wherein the nanostructure is comprised of at least one of a dielectric material or a plasmonic material.

6. The device according to claim 1, wherein the organic or organometallic material is material is capable of emitting a blue, green, or red light.

7. The device according to claim 1, wherein the organic or organometallic material is selected from the group consisting of bis[2-(4,6-difluorophenyl)pyridinato-C2,N](picolinato)iridium(III); bis(2,4-difluorophenylpyridinato)tetrakis(1-yrazolyl)borate iridium(III); 4,5-di(9H-carbazol-9-yl)phthalonitrile; or (PCP)Ir(ppy)Cl complex.

8. The device according to claim 1, wherein the nanostructure is a nanoantenna, a nanoparticle, a nanoporous film, or an imprinted grating.

9. The device according to claim 8, wherein the nanoparticle is a nanorod, nanosphere, nanotriangle, nanostar, or nanocube with dimensions less than the wavelength of the emission of the organic or organometallic material.

10. The device according to claim 1, wherein the organic material is doped into a layer comprising a host material.

11. The device according to claim 10, wherein the host material is a polyvinylcarabzole (PVK) conjugated polymer or a conjugated polymer that has a triplet energy level higher than the triplet state of the organic or organometallic emitting material.

12. The device according to claim 10, wherein the nanostructure is substantially surrounded by the host material.

13. The device according to claim 1, wherein the organic layer has a thickness of between about 20 nm and about 200 nm.

14. The device according to claim 1, wherein the organic material is in a separate layer from the nanostructure.

15. The device according to claim 1, wherein the organic material is coated around or attached to the nanostructure such that the organic material and nanostructure form a hybrid nanoparticle structure.

16. The device according to claim 1, further comprising at least one layer selected from the group consisting of an anode, a cathode, a hole transport layer, a hole blocking layer, an electron transport layer, a hole injection layer, and an electron injection layer.

17. The device according to claim 1, wherein the at least one nanostructure consists of one or more dielectric materials.

18. The device according to claim 1, further comprising a metal layer positioned on a first side of the at least one substantially planar organic layer,
   wherein the at least one nanostructure is position on a second side of the at least one substantially planar organic layer, the second side being opposite the first side.

19. A method of shortening a radiative lifetime of an organic material radiative in an emission band and increasing the stability of emission, the method comprising the steps of:
   providing said organic material within a substantially planar organic layer;
   and producing at least one nanostructure in or on the substantially planer organic layer configured to have local electric fields at wavelengths that spectrally and spatially overlap with said emission band of said radiative organic material.

20. The method according to claim 19, wherein the nanostructure is a nanoantenna, a nanoparticle, a nanoporous film, or an imprinted grating.

21. The method according to claim 19, wherein the at least one organic material comprises a light emitting organic material capable of emitting via at least one pathway selected from the group consisting of phosphorescence or thermally-assisted delayed fluorescence.

* * * * *